(12) United States Patent
Namikawa

(10) Patent No.: US 6,881,658 B2
(45) Date of Patent: Apr. 19, 2005

(54) PROCESS OF AND APPARATUS FOR HEAT-TREATING II-VI COMPOUND SEMICONDUCTORS AND SEMICONDUCTOR HEAT-TREATED BY THE PROCESS

(75) Inventor: Yasuo Namikawa, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 76 days.

(21) Appl. No.: 10/243,198

(22) Filed: Sep. 13, 2002

(65) Prior Publication Data

US 2003/0073259 A1 Apr. 17, 2003

(30) Foreign Application Priority Data

Oct. 17, 2001 (JP) ........................................ 2001-319630

(51) Int. Cl.[7] .............................................. H01L 21/28
(52) U.S. Cl. ........................ 438/602; 438/59; 438/509; 438/796
(58) Field of Search ................... 438/602–67, 734–737, 438/184–197, 59, 796, 509

(56) References Cited

U.S. PATENT DOCUMENTS

| | | | | |
|---|---|---|---|---|
| 4,155,784 A | * | 5/1979 | Mills et al. ................... 117/91 |
| 4,596,645 A | * | 6/1986 | Stirn ...................... 204/192.25 |
| 4,704,257 A | * | 11/1987 | Tomizawa et al. .......... 117/203 |
| 4,849,033 A | * | 7/1989 | Vander Sande et al. ...... 438/54 |
| 4,866,007 A | * | 9/1989 | Taguchi et al. ................. 117/7 |
| 4,908,329 A | * | 3/1990 | Kanai et al. ................. 427/575 |
| 4,909,998 A | * | 3/1990 | Nishizawa .................. 117/223 |
| 5,240,685 A | * | 8/1993 | Nishizawa .................. 117/202 |
| 5,433,791 A | * | 7/1995 | Brewer et al. ............... 118/724 |
| 5,714,008 A | * | 2/1998 | Lee et al. .................... 118/715 |
| 5,933,751 A | | 8/1999 | Hirota |
| 6,090,350 A | * | 7/2000 | Birken et al. ................ 422/186 |
| 6,120,661 A | * | 9/2000 | Hirano et al. .......... 204/298.15 |
| 6,132,506 A | | 10/2000 | Hirota et al. |
| 6,241,820 B1 | * | 6/2001 | Ohuchi et al. ................. 117/81 |
| 6,273,969 B1 | * | 8/2001 | Dutta et al. .................. 148/404 |
| 6,337,536 B1 | * | 1/2002 | Matsubara et al. ......... 313/498 |
| 6,399,473 B1 | * | 6/2002 | Fischer et al. .............. 438/602 |
| 6,440,866 B1 | * | 8/2002 | Collins et al. .............. 438/714 |
| 6,780,244 B1 | * | 8/2004 | Kawase et al. ............. 117/206 |

FOREIGN PATENT DOCUMENTS

| | | |
|---|---|---|
| JP | 09165300 A | 6/1997 |
| JP | 2839027 | 10/1998 |
| RU | 2 170 291 C1 | 7/2001 |

OTHER PUBLICATIONS

The electrical properties of zinc selenide by G. John and J. Woods, J. Phys. D: Appl. Phys., vol. 9, 1976, pp 799–810 (Prior Art cited in the Specification).

* cited by examiner

Primary Examiner—Michael Lebentritt
(74) Attorney, Agent, or Firm—Fish & Richardson P.C.

(57) ABSTRACT

A process of heat-treating II-VI compound semiconductors reduces the electrical resistivity without the decrease in crystallinity resulting from the increase in dislocation density. The process comprises the following steps:(a) placing at least one II-VI compound semiconductor in contact with aluminum in a heat-treating chamber having the inside surface formed by at least one material selected from the group consisting of pyrolytic born nitride, hexagonal-system boron nitride, sapphire, alumina, aluminum nitride, and polycrystalline diamond; and (b) heat-treating the II-VI compound semiconductor or semiconductors in a gaseous atmosphere containing the group II element constituting part of the II-VI compound semiconductor or semiconductors. A II-VI compound semiconductor is heat-treated by the foregoing process. An apparatus for heat-treating II-VI compound semiconductors comprises components for performing the foregoing process.

12 Claims, 2 Drawing Sheets

PROCESS OF AND APPARATUS FOR HEAT-TREATING II-VI COMPOUND SEMICONDUCTORS AND SEMICONDUCTOR HEAT-TREATED BY THE PROCESS

BACKGROUND OF THE INVENTION

1. Field of the Invention

The present invention relates to a process of and an apparatus for heat-treating compound semiconductors and a compound semiconductor heat-treated by the process, and more particularly, to a process of and an apparatus for heat-treating II-VI compound semiconductors (expressed by the group in the Periodic Table) and a II-VI compound semiconductor heat-treated by the process.

2. Description of the Background Art

Zinc selenide (ZnSe)-based light-emitting devices have been attracting attention as laser diodes or light-emitting diodes (LEDs) that emit short-wavelength light such as blue, green, and bluish green. These light-emitting devices can be produced on a gallium arsenide (GaAs) substrate, which is made of a material different from ZnSe. However, to increase the crystallinity of a ZnSe-based thin film formed on a substrate and to improve the device property, it is desirable that the ZnSe-based thin film be formed by homoepitaxial growth on a ZnSe substrate.

Recent years have seen the development of technology for producing a white LED by a novel concept in which white light is obtained by mixing short-wavelength light emitted by an active layer formed on a ZnSe substrate and long-wavelength light emitted by the ZnSe substrate itself excited by the light emission of the active layer. In the case of the white LED, it is essential to use a ZnSe substrate for utilizing the light emission of the substrate itself.

As a result, a single-crystalline ZnSe substrate is used as the substrate for a light-emitting device. To simplify the structure of the device for improving the device property, it is essential to increase the electrical conductivity, or decrease the resistivity, of the substrate. However, conventional ZnSe bulk single crystals produced by the physical vapor transport (PVT) method and the grain growth (GG) method have high resistivities because they are undoped (no donor impurities are doped).

The resistivity of a ZnSe single crystal can be reduced by heat-treating it in a Zn—Al melt. An example of this method has been proposed by G. Jones and J. Woods in a paper included in J. Phys. Vol. 9, 1976 on pp. 799–810. According to this method, Al diffused in the ZnSe crystal acts as a doner impurity, and the concentration of Zn vacancies decreases concurrently. These phenomena can increase the activation rate of the Al and the concentration of the n-type carriers. As a result, the targeted resistivity can be achieved.

However, this heat-treating process cannot prevent the melt from adhering to the ZnSe single crystal at the time of cooling. Consequently, the stress caused by the difference in thermal expansion between the ZnSe and the melt increases the dislocation density of the ZnSe single crystal, notably decreasing the crystallinity. As a result, the light-emitting device produced by this process poses a problem of life-time reduction.

To solve this problem, Japanese patent 2839027 has disclosed a process in which a ZnSe single crystal having a thin Al film formed on its surface is placed in a hermetically sealed quartz container to be heat-treated in a zinc vapor atmosphere. This process can suppress the notable increase in dislocation density for a substrate having a dislocation density of at least $5 \times 10^4$ cm$^{-2}$ before the heat-treatment.

However, this process has a problem in that the dislocation density increases with increasing thickness of the Al film when a substrate having higher crystallinity with smaller dislocation density is heat-treated under the same conditions. More specifically, when a substrate having a dislocation density of less than $5 \times 10^4$ cm$^{-2}$ is used for an Al film having a thickness of at least 40 nm, the dislocation density increases. This increase can be prevented when the thickness of the Al film is decreased. However, the carrier density of the ZnSe substrate after the heat-treatment depends on the thickness of the Al film before the heat-treatment. Therefore, when the thickness of the Al film is decreased, the carrier density decreases and the resistivity of the ZnSe substrate increases. More specifically, according to the conventional process, when the thickness of the Al film is decreased to less than 40 nm, the carrier density decreases to at most $6 \times 10^{17}$ cm$^{-3}$.

In other words, the conventional technology has a problem in that when the thickness of the Al film is increased to reduce the resistivity by increasing the carrier density, the dislocation density increases and when the thickness of the Al film is decreased to reduce the dislocation density, the carrier density decreases, increasing the resistivity.

SUMMARY OF THE INVENTION

The present invention aims to solve the above-described problems. An object of the present invention is to offer a process of heat-treating II-VI compound semiconductors for reducing the electrical resistivity without the decrease in crystallinity resulting from the increase in dislocation density. Another object is to offer a II-VI compound semiconductor heat-treated by the process. Yet another object is to offer an apparatus for heat-treating II-VI compound semiconductors by the foregoing process.

A process of the present invention for heat-treating II-VI compound semiconductors comprises the following steps:

(a) placing at least one II-VI compound semiconductor in contact with aluminum in a heat-treating chamber having the inside surface formed by at least one material selected from the group consisting of pyrolytic born nitride (pBN), hexagonal-system boron nitride (hBN and wBN), sapphire, alumina (Al$_2$O$_3$), aluminum nitride (AlN), and polycrystalline diamond; and (b) heat-treating the II-VI compound semiconductor or semiconductors in a gaseous atmosphere containing the group II element constituting part of the II-VI compound semiconductor or semiconductors.

In the above description, hBN denotes low-pressure phase boron nitride having a structure similar to hexagonal-system graphite, and wBN denotes boron nitride having a hexagonal-system wurtzite structure.

According to the heat-treating process of the present invention comprising the foregoing steps, the inside surface of the heat-treating chamber is formed by at least one material selected from the group consisting of pBN, hBN, wBN, sapphire, Al$_2$O$_3$, AlN, and polycrystalline diamond. These materials are stable at the heat-treating temperature, are chemically nonreactive with a II-VI compound semiconductor, and do not contaminate the II-VI compound semiconductor with impurities. Consequently, the increase in the amount of aluminum contacting the surface of the II-VI compound semiconductor does not increase the number of crystal defects in the semiconductor during the heat-treatment. As a result, a large amount of aluminum can be doped into the semiconductor for reducing the electrical resistivity without decreasing the crystallinity.

The heat-treating process may further comprise the step of evacuating the heat-treating chamber with a vacuum pump prior to the step of heat-treating the II-VI compound semiconductor or semiconductors. This evacuation can remove gaseous impurities remaining in the heat-treating chamber to prevent generation of crystal defects in the semiconductor or semiconductors.

The heat-treating process may also be performed by forming an aluminum film on the surface of the II-VI compound semiconductor or semiconductors. The formation of the aluminum film increases the contacting area between the semiconductor or semiconductors and the aluminum. As a result, the amount of the doped aluminum can be increased.

The foregoing aluminum film may have a thickness of 1 to 200 nm.

The heat-treating process may also be performed by placing in the heat-treating chamber two II-VI compound semiconductors having an aluminum film on their surfaces such that the aluminum films are in contact with each other.

The heat-treatment may be performed at a temperature of 660 to 1,200° C.

The heat-treatment may also be performed for 1 to 800 hours.

The heat-treating process may be performed by cooling the heat-treated II-VI compound semiconductor or semiconductors at a rate of 1 to 200° C./min.

The foregoing cooling of the heat-treated II-VI compound semiconductor or semiconductors may be performed by providing in the heat-treating chamber a portion having a temperature lower than that of the semiconductor or semiconductors by 1 to 100° C.

The II-VI compound semiconductor or semiconductors to be heat-treated by the heat-treating process may be made of ZnSe.

A II-VI compound semiconductor of the present invention is heat-treated by the following steps:

(a) placing at least one II-VI compound semiconductor in contact with aluminum in a heat-treating chamber having the inside surface formed by at least one material selected from the group consisting of pyrolytic born nitride, hexagonal-system boron nitride, sapphire, alumina, aluminum nitride, and polycrystalline diamond; and (b) heat-treating the II-VI compound semiconductor or semiconductors in a gaseous atmosphere containing the group II element constituting part of the II-VI compound semiconductor or semiconductors.

The II-VI compound semiconductor heat-treated by the foregoing steps may have an aluminum concentration of $1 \times 10^{16}$ to $5 \times 10^{20}$ cm$^{-3}$ and a dislocation density of at most $5 \times 10^4$ cm$^{-2}$ in the region from the main surface to a depth of 300 µm.

An apparatus of the present invention for heat-treating II-VI compound semiconductors comprises a heat-treating chamber for encasing at least one II-VI compound semiconductor to be heat-treated. The inside surface of the heat-treating chamber is formed by at least one material selected from the group consisting of pBN, hBN, wBN, sapphire, $Al_2O_3$, AlN, and polycrystalline diamond.

According to the apparatus of the present invention, the materials forming the inside surface of the heat-treating chamber are stable at the heat-treating temperature, are chemically nonreactive with a II-VI compound semiconductor, and do not contaminate the II-VI compound semiconductor with impurities. Consequently, the apparatus can suppress the generation of dislocations in the II-VI compound semiconductor during the heat-treatment. As a result, the apparatus can produce II-VI compound semiconductors having few crystal defects and low electrical resistivity.

The heat-treating chamber of the apparatus may be provided in it with an isolating member for isolating the II-VI compound semiconductor or semiconductors from a group II element placed in the same heat-treating chamber, the group II element constituting part of the semiconductor or semiconductors.

In this case, the isolating member can prevent the II-VI compound semiconductor or semiconductors from contacting the group II element. Consequently, the decrease in crystallinity of the II-VI compound semiconductor or semiconductors can be prevented.

The surface of the isolating member may be formed by at least one material selected from the group consisting of pBN, hBN, wBN, sapphire, $Al_2O_3$, AlN, and polycrystalline diamond.

These materials are stable at the heat-treating temperature, are chemically nonreactive with a II-VI compound semiconductor, and do not contaminate the II-VI compound semiconductor with impurities. Consequently, these materials enable the production of II-VI compound semiconductors having low electrical resistivity without reducing the crystallinity.

The apparatus for heat-treating II-VI compound semiconductors may further comprise a box enclosing the heat-treating chamber. The box can be evacuated with a vacuum pump to reduce the pressure in the heat-treating chamber.

According to the present invention, the employment of the foregoing structure enables the suppression of the chemical reaction between Al and quartz while a II-VI compound semiconductor such as a ZnSe crystal is heat-treated for diffusing Al into the crystal. The present invention therefore can offer a conductive ZnSe crystal having superior crystallinity.

DETAILED DESCRIPTION OF THE INVENTION

Embodiments of the present invention are explained below.

In the present invention, the heat-treatment may be carried out by maintaining the raised temperature at a fixed level, by maintaining it at different levels after changing the temperature, or by continuously changing it with time.

Figure 2:
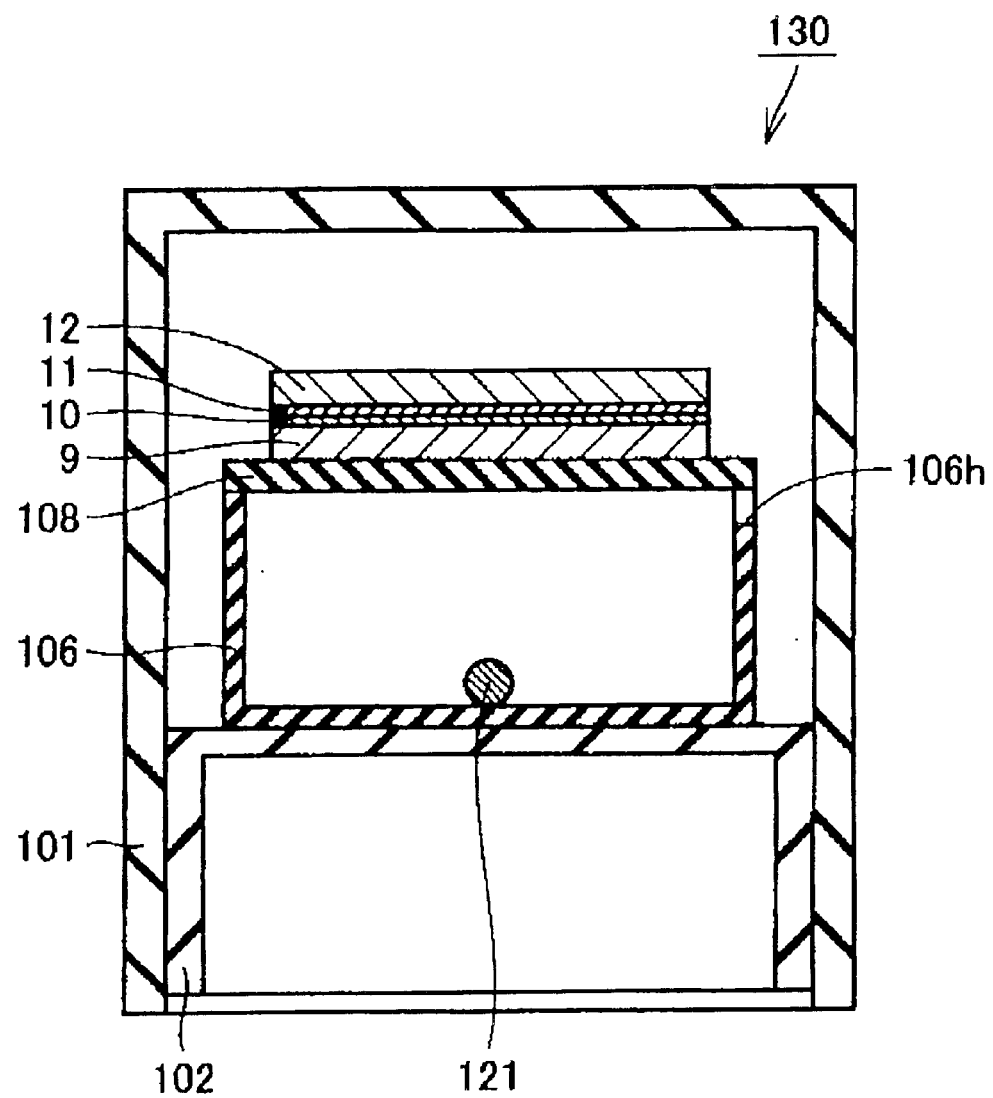
FIG. 2 is a cross-sectional view showing a conventional heat-treating apparatus.

The present inventor did a study on the cause of the increase in dislocation in a ZnSe substrate when heat-treated by the conventional heat-treating process. FIG. 2 is a cross-sectional view showing a conventional heat-treating apparatus. A conventional heat-treating apparatus 130 comprises a quartz ampule-like container (hereinafter referred to as "ampule") 101, a quartz sealing cap 102, which is fitted into the quartz ampule 101 to form a specified space, a quartz container 106, which is placed on the quartz sealing cap 102 and enclosed by the quartz ampule 101, and a quartz plate 108, which is placed on the quartz container 106.

ZnSe substrates 9 and 12 are placed on the quartz plate 108, and aluminum films 10 and 11 are sandwiched between the ZnSe substrates 9 and 12. The quartz container 106 is provided with a notch 106h. A Zn crystal 121 is placed in the quartz container 106.

When the apparatus is assembled as described above, first, the quartz ampule 101 is evacuated with a vacuum pump, and then the portion of quartz ampule 101 into which the quartz cap 102 is fitted is heated. This heating fuses the quartz, and the quartz members are bonded together to hermetically seal the quartz ampule 101. The hermetically sealed heat-treating apparatus 130 is placed in a furnace to be heated and maintained at the elevated temperature. This heating vaporizes part of the Zn crystal 121, and the quartz ampule 101 is filled with a zinc vapor. Concurrently, the aluminum films 10 and 11 are melted, and the molten aluminum diffuses into the ZnSe crystals that constitute the ZnSe substrates 9 and 12. This process renders the ZnSe substrates 9 and 12 electrically conductive.

This heat-treating process increases the dislocation density of the ZnSe substrates 9 and 12. Some chemical-reaction products in the above mechanism may play a role in increasing the dislocation density. To clarify the mechanism, the present inventor calculated the state of the thermodynamic equilibrium on a system composed of the starting materials ZnSe, Zn, Al, and quartz to analyze the state of the chemical reaction. The analysis revealed the following phenomena.

Aluminum does not exist stably as a single body. It stably exists as the oxide $Al_2SiO_5$ known as andalusite at temperatures ranging from room temperature to about 990° C. It stably exists as mullite (3 $Al_2O_3 \cdot 2SiO_2$) at temperatures higher than about 990° C. In a gas phase, a Zn vapor is the principal constituent, and SiO stably exists with a notable partial pressure. The approximate composition ratio of Zn to SiO is $1:10^{-3}$ at 1,000° C.

This analysis shows that when ZnSe, Zn, and Al are placed in a hermetically sealed quartz ampule 101 and heated to a certain extent, the Al vaporizes and chemically reacts with the quartz. Concurrently, the SiO has a chemical reaction with Al at the surface of the Al resulting in a continuous production of andalusite and mullite. The analysis suggests that although the Al diffuses into the ZnSe crystal, the andalusite and mullite remain on the surface of the ZnSe. It is likely that the andalusite and mullite adhering to the surface of the ZnSe cause some stresses to the ZnSe crystal when they are cooled, thereby decreasing the crystallinity of the ZnSe crystal.

According to this hypothesis, it is clear that the coexistence of Al and quartz produces andalusite or mullite. The present inventor considered that in order to completely suppress the decrease in crystallinity of the ZnSe when heat-treatment is performed to diffuse aluminum, the heat-treatment must be carried out in a quartz-free environment. As a result, the present inventor devised a novel heat-treating process in which no quartz container is used for encasing a ZnSe crystal.

It is required that a container for encasing ZnSe include no quartz nor silicon (Si) in its constituting materials, be stable at the heat-treating temperature, be nonreactive with ZnSe, be highly pure such that it does not contaminate ZnSe with impurities, and be excellent in gastightness. It is also required that a plate and other members to be placed in the container have the same property as above. The types of materials having such properties include pyrolytic born nitride (pBN), hexagonal-system boron nitride, sapphire, alumina, aluminum nitride, and polycrystalline diamond.

Ideally, it is desirable to form a vacuum space with a container made of a material such as described above to enclose a ZnSe substrate. However, it is difficult to maintain a vacuum with these materials alone, because the entire container must be maintained at the elevated temperature. To solve this difficulty, a quartz ampule is used as an outer container. A container made of a material such as described above enclosing a ZnSe substrate can be placed in a quartz ampule to evacuate the quartz ampule with a vacuum pump. In this case, it is necessary to provide a communicating hole in the container to evacuate the container and to eliminate the pressure difference between the inside and outside of the container when the elevated temperature is maintained. It is desirable that the communicating hole be a small-diameter orifice to minimize the diffusion of the gaseous SiO into the container through the orifice.

Figure 1:
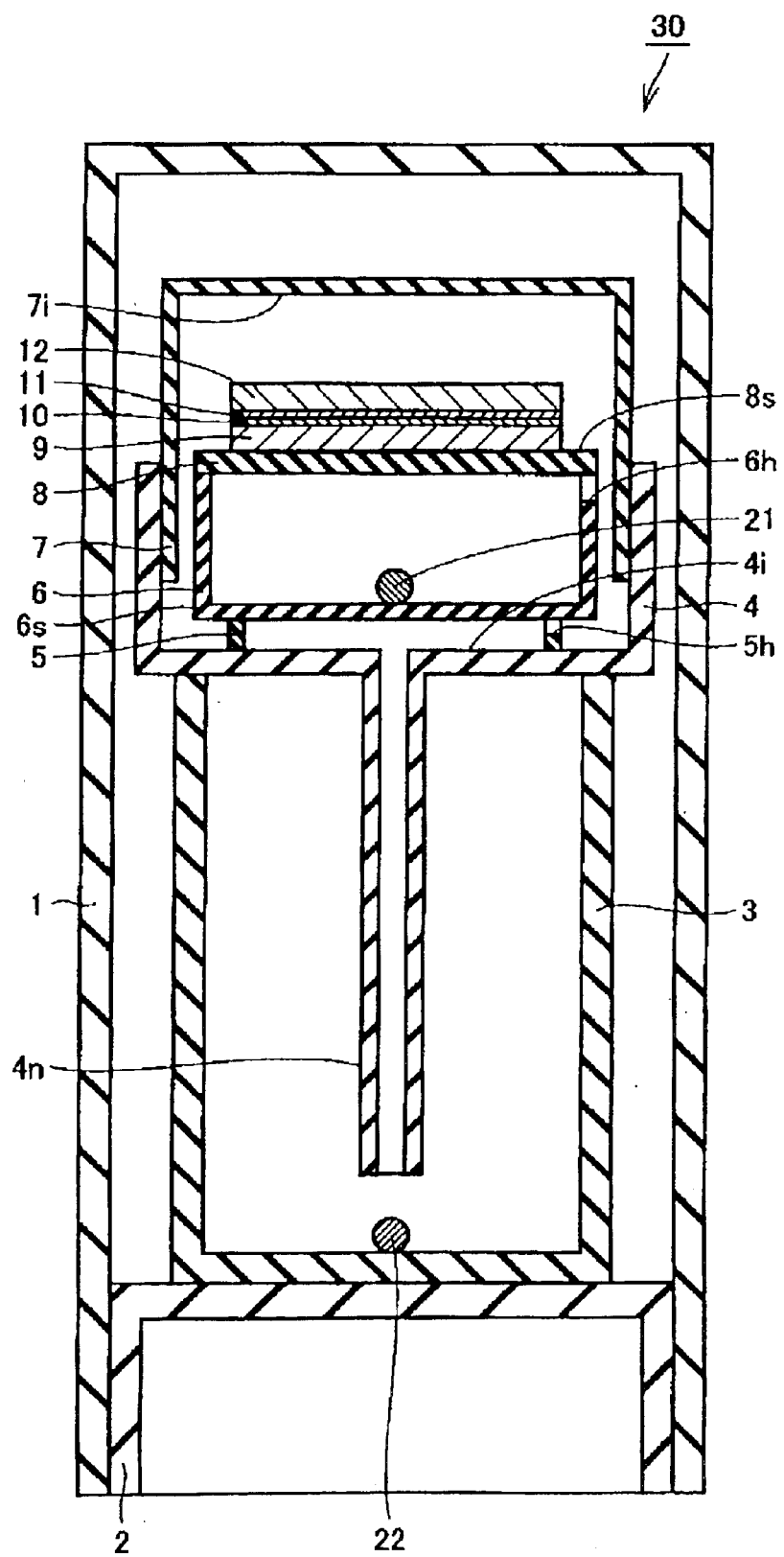
FIG. 1 is a cross-sectional view showing heat-treating apparatus of the present invention.

FIG. 1 is a cross-sectional view showing a heat-treating apparatus of the present invention. A heat-treating apparatus 30 comprises the following members:

(a) a quartz ampule 1;
(b) a quartz sealing cap 2 fitted into the quartz ampule 1;
(c) a quartz support 3 placed on the quartz sealing cap 2;
(d) a pBN container's lower portion 4 placed on the quartz support 3;
(e) a pBN container's main body 7 fitted into the pBN container's lower portion 4;
(f) a pBN support 5 placed on the lower plate of the pBN container's lower portion 4;
(g) a pBN cup 6 placed on the pBN support 5; and
(h) a sapphire plate 8 placed on the pBN cup 6.

The quartz ampule 1 is designed to have a specified space and provided with an opening. The quartz sealing cap 2 is fitted into the opening. The quartz support 3 is placed on the quartz sealing cap 2. A Zn crystal 22 is placed in the quartz support 3.

The pBN container's lower portion 4 is placed on the quartz support 3. The pBN container's lower portion 4 is provided with an orifice 4n. The orifice 4n extends downward in the space enclosed by the quartz support 3 and faces the Zn crystal 22. The pBN support 5 is placed on the lower plate of the pBN container's lower portion 4. The pBN support 5 is provided with a notch 5h. The notch 5h and the orifice 4n approximately equalize the pressure of the space in the quartz support 3 and the pressure of the space produced by the pBN container's lower portion 4 and main body 7.

The pBN container's main body 7 is fitted into the pBN container's lower portion 4. The pBN cup 6 and the sapphire plate 8 are placed in the space produced by the pBN container's lower portion 4 and main body 7. A Zn crystal 21 is placed in the pBN cup 6. The pBN cup 6 is provided with a notch 6h. The notch 6h approximately equalizes the pressure of the space produced by the pBN cup 6 and the sapphire plate 8 and the pressure of the space produced by the pBN container's lower portion 4 and main body 7.

A ZnSe substrate 9 is placed on the sapphire plate 8. An aluminum film 10 is formed on the ZnSe substrate 9. Another ZnSe substrate 12 having an aluminum film 11 formed on it is placed on the aluminum film 10 such that the aluminum films 10 and 11 are in contact with each other.

The heat-treating apparatus 30 of the present invention devised for heat-treating II-VI compound semiconductors has a particular heat-treating chamber. The heat-treating chamber comprises the pBN container's main body 7 having a particular inside surface 7i and the pBN container's lower portion 4 having a particular inside surface 4i. The inside surfaces 7i and 4i directly surround the II-VI compound semiconductors to be heat-treated. The inside surfaces 7i and 4i are formed by pBN. They may also be formed by at least one material selected from the group consisting of hexagonal boron nitride (such as hBN and wBN), sapphire, alumina, aluminum nitride, and polycrystalline diamond.

The heat-treating apparatus 30 further comprises the pBN cup 6 and the sapphire plate 8 both placed in the space produced by the pBN container's main body 7 and lower portion 4. The pBN cup 6 and the sapphire plate 8 isolate the ZnSe substrates 9 and 12 as the II-VI compound semiconductors to be heat-treated from the Zn crystal 21 being the group II element constituting part of the II-VI compound semiconductors. The pBN cup 6 and the sapphire plate 8 have particular outside surfaces 6s and 8s, respectively. The outside surfaces 6s and 8s are formed by pBN. They may also be formed by at least one material selected from the group consisting of hexagonal-system boron nitride (hBN and wBN), sapphire, alumina, aluminum nitride, and polycrystalline diamond.

The heat-treating apparatus 30 further comprises the quartz ampule 1 and the quartz sealing cap 2 for forming a box enclosing the heat-treating chamber. The space produced by the quartz ampule 1 and the quartz sealing cap 2 can be evacuated through the clearance between the two members with a vacuum pump. This evacuation reduces the pressure inside the quartz support 3 through the clearance between the quartz support 3 and the pBN container's lower portion 4. Finally, the pressure inside the pBN container's main body 7 and lower portion 4 can be reduced through the orifice 4n and notch 5h.

The heat-treatment process using the heat-treating apparatus 30 is explained in detail below. The ZnSe substrates 9 and 12 provided with the respective evaporation-deposited aluminum films 10 and 11 on their surfaces are placed in the space enclosed by the pBN container's main body 7 and lower portion 4, which constitute the heat-treating chamber having the inside surface formed by highly purified pBN. Although FIG. 1 shows two ZnSe substrates 9 and 12 placed in the heat-treating chamber, one ZnSe substrate may be used. Furthermore, more than two ZnSe substrates may be placed inside by stacking them, for example. In FIG. 1, the two ZnSe substrates 9 and 12 are placed such that the aluminum films 10 and 11 are in close contact with each other. This arrangement is employed in order to minimize the contact between the aluminum films 10 and 11 and the gaseous atmosphere.

The disk-shaped sapphire plate 8 is placed on the pBN cup 6. The heat-treating chamber comprises the pBN container's main body 7 and lower portion 4. The lower portion 4 is provided with the orifice 4n. The pBN container's main body 7 is fitted into the lower portion 4 to maintain gastightness. The pBN container's main body 7 and lower portion 4, the quartz support 3, and the Zn crystal 22 are encased in the quartz ampule 1, and the quartz cap 2 is fitted into the quartz ampule 1. An aluminum crystal may also be encased concurrently in the quartz ampule 1. When the inside space of the quartz ampule 1 is evacuated with a vacuum pump, the inside space of the pBN container's main body 7 and lower portion 4 constituting the heat-treating chamber is concurrently evacuated through the clearance between the quartz support 3 and the lower portion 4, the orifice 4n, and the notch 5h. When the vacuum degree reaches the specified level, the quartz ampule 1's portion into which the quartz sealing cap 2 is fitted is heated to hermetically seal the quartz ampule 1 under the vacuum condition.

The heat-treating apparatus 30 is placed in a furnace for heat-treatment. It is desirable to maximize the uniformity of the temperature distribution in the quartz ampule 1 to suppress an excessive increase in the pressure of the Zn vapor and to prevent the Zn vapor from condensing at a low-temperature portion. When the quartz ampule 1 is maintained at a specified temperature for a specified time, the aluminum diffuses into the ZnSe substrates 9 and 12. When the step for maintaining the elevated temperature is completed, the ZnSe substrates 9 and 12 are cooled at a specified rate. The above-described process can produce a ZnSe substrate increased not only in electrical conductivity but also in crystal quality.

As explained above, a process of the present invention for heat-treating II-VI compound semiconductors comprises the following steps:

(a) placing the ZnSe substrates 9 and 12 (as the II-VI compound semiconductors) in contact with aluminum in the heat-treating chamber comprising the pBN container's main body 7 and lower portion 4 having the respective inside surfaces 7i and 4i formed by at least one material selected from the group consisting of pyrolytic born nitride, hexagonal-system boron nitride, sapphire, alumina, aluminum nitride, and polycrystalline diamond; and (b) heat-treating the ZnSe substrates 9 and 12 in a gaseous atmosphere containing the Zn vapor (as the group II element constituting part of the II-VI compound semiconductors).

It is desirable that the aluminum films 10 and 11 have a thickness of 1 to 200 nm. If the thickness is less than 1 nm, the amount of Al diffusion into the ZnSe is insufficient to reduce the resistivity of the ZnSe crystal. If the thickness is more than 200 nm, Al or Al—Zn alloys remain on the surface of the ZnSe substrates 9 and 12. They exert stresses on the ZnSe crystal during the cooling period, causing a reduction in crystallinity.

It is also desirable that the heat-treatment be performed at a temperature of 660 to 1,200° C. If the temperature is lower than 660° C., the Al does not diffuse in the ZnSe crystal effectively because the Al exists in a solid state. If the temperature is higher than 1,200° C., the crystallinity of the ZnSe crystal is decreased.

It is also desirable that the heat-treatment be performed for 1 to 800 hours. If the heat-treating time is less than 1 hour, the Al cannot completely diffuse into the ZnSe, and Al remains on the surface of the ZnSe substrate. The remaining Al exerts stresses on the ZnSe crystal during the cooling period, causing the reduction in crystallinity. If the heat-treating time is longer than 800 hours, after diffusing into the ZnSe substrate completely, the Al migrates excessively toward the peripheral portion of the substrate. As a result, the concentration of the Al in the ZnSe decreases with time. Therefore, an excessively long heat-treatment is undesirable.

It is also desirable that the cooling rate after the heat-treatment be 1 to 200° C./min. If the cooling rate is higher than 200° C./min, the temperature gradient in the ZnSe crystal becomes large, and the crystallinity decreases during the cooling time. If the cooling rate is lower than 1° C./min, because the time for passing the low-temperature zone is prolonged, the properties of the ZnSe approaches those at the low-temperature equilibrium. As a result, the percentage of the activation of Al decreases, decreasing the carrier density and increasing the resistivity.

When the ZnSe crystal contacts Zn, Al, or a Zn—Al alloy at the time of cooling, the difference in their coefficient of thermal expansion decreases the crystallinity of the ZnSe considerably. When some portion other than the place where the ZnSe substrates 9 and 11 are placed is controlled to become the lowest-temperature portion in the heat-treating chamber at the time of cooling, the Zn, Al, and Zn—Al alloy are transferred to the lowest-temperature portion to solidify there. Thus, the contact between the ZnSe crystal and the Zn, Al, or Zn—Al alloy can be avoided, thereby preventing the reduction in the crystallinity.

It is desirable that the temperature difference between the place where the ZnSe substrates 9 and 11 are placed and the lowest-temperature portion be 1 to 100° C. If the temperature difference is less than 1° C., the lowest-temperature portion is not affected. If the temperature difference is more than 100° C., the ZnSe crystal itself is transferred to the lowest-temperature portion, and its crystallinity is decreased undeniably. While the elevated temperature is maintained, the temperature distribution within the heat-treating chamber may be completely uniform. Multilayer temperature distribution may also be present during the high-temperature-maintaining period providing that the temperature distribution causes no noticeable transfer of the ZnSe crystal itself.

EXAMPLE 1

Heat-treatment was performed on a ZnSe substrate having a length of 20 mm, a width of 20 mm, and a thickness of 700 $\mu$m and composed of a ZnSe single crystal in which the (100) plane forms the main surface. The resistivity of the crystal before the heat-treatment was as high as at least $10^5$ $\Omega$cm, which was the upper limit in the hall mobility measurement. The substrate surface was mirror polished and etched by using Br-methyl alcohol to measure the dislocation density of the crystal. The measured result was $5 \times 10^3$ to $2 \times 10^4$ cm$^{-2}$.

An aluminum film with a thickness of 40 nm was formed on the etched surface by the vacuum deposition method. As shown in FIG. 1, the ZnSe substrates 9 and 12 were placed in the quartz ampule 1 such that the aluminum films 10 and 11 were in contact with each other. Concurrently, the Zn crystals 21 and 22 each having a mass of 0.1 g were placed in the quartz ampule 1. The assembled quartz ampule 1 was evacuated with a vacuum pump to a vacuum of $2 \times 10^{-8}$ torr ($2.7 \times 10^{-6}$ Pa). With this vacuum degree maintained, the quartz ampule 1 was hermetically sealed by fusing the quartz cap 2.

The sealed heat-treating apparatus 30 was placed in a vertical-tube furnace. The heat-treatment was carried out for seven days (168 hours) by heating the ZnSe substrates 9 and 12 at a uniform temperature of 1,000° C. with the temperature at the lower of the quartz ampule 1 maintained at 980° C. Then, the heat-treating apparatus 30 was cooled to room temperature at a rate of 60° C./min. The disassembly of the apparatus revealed solidified Zn at the lower of the quartz ampule 1. The ZnSe substrates 9 and 12 placed to face each other were easily separated without sticking together. The aluminum films 10 and 11 deposited on the ZnSe substrates 9 and 12 were not observed on the surface of the substrates with naked eye. They were thought to have disappeared by diffusing into the crystal and dispersing into the atmosphere.

The surface of the heat-treated ZnSe substrate 9 where the aluminum film 10 had once been deposited was repolished to reduce the thickness by 50 $\mu$m. The properties of the substrate were then measured. The carrier density at the surface was $8 \times 10^{17}$ cm$^{-3}$, demonstrating that the resistivity was reduced. The maximum local value of the dislocation density at the surface was about $5 \times 10^3$ cm$^{-2}$. This value confirmed that there was no increase in dislocation density.

The distribution of the aluminum concentration at the surface of the heat-treated substrate was measured by secondary-ion mass spectrometry (SIMS). The aluminum concentration was $1.8 \times 10^{19}$ cm$^{-3}$ at the central portion and $2.2 \times 10^{18}$ cm$^{-3}$ at the peripheral portion. The results show that the aluminum was distributed nearly uniformly. Vaporization of the Al and chemical reaction between the Al and SiO were suppressed during the heat-treatment by encasing the ZnSe substrates 9 and 12 in the pBN container to avoid direct exposure to quartz and by limiting the transfer of the SiO gas with the orifice 4n. The present inventor believes that this suppression produced the uniform distribution of the aluminum diffusion into the ZnSe. He also believes that the suppression of the reaction producted between the Al and SiO contributed to the prevention of the reduction in crystallinity.

EXAMPLE 2

Low-resistivity ZnSe substrates were produced by diffusing Al employing a process similar to that used in Example 1. The surface of a heat-treated ZnSe substrate where the aluminum had once been deposited was polished to reduce the thickness by 100 $\mu$m. The surface was finished by mirror polishing. The ZnSe substrate was etched with a dichromate solution to reduce the thickness by 3 $\mu$m. The obtained substrate was placed in a molecular-beam epitaxy (MBE) unit to grow a thin ZnSe film having a thickness of 1.5 $\mu$m.

The grown ZnSe film had a good surface morphology. The surface was etched by using a Br-methyl alcohol solution to measure the dislocation density of the epitaxial layer. The dislocation density increased by about $3 \times 10^3$ cm$^{-2}$ during the epitaxial growth. As a result, the total dislocation density including the dislocation introduced by the ZnSe substrate was $8 \times 10^3$ to $2.5 \times 10^4$ cm$^{-2}$, showing that high crystallinity was maintained.

Subsequently, the other side of the epitaxially grown ZnSe substrate was polished to reduce the thickness to 250 $\mu$m. When the carrier density at the other surface of the ZnSe substrate was measured by the capacity-voltage (C-V) method, the result was about $7 \times 10^{17}$ cm$^{-3}$. The result confirmed that the other side had high carrier density sufficient for forming n-type electrodes.

Comparative Example

Single-crystalline ZnSe substrates were produced by a process similar to that used in Example 1. As with Example 1, the resistivity of the crystal before the heat-treatment was as high as at least $10^5$ $\Omega$cm, which is the upper limit in the hall mobility measurement. The substrate surface was polished and etched by the same method as in Example 1 to measure the dislocation density of the crystal. The measured result was the same as in Example 1. An aluminum film with a thickness of 40 nm was formed on the etched surface by the vacuum deposition method. As shown in FIG. 2, the ZnSe substrates 9 and 12 were placed in the quartz ampule 101 such that the aluminum films 10 and 11 were in contact with each other. Concurrently, the Zn crystal 121 having a mass of 0.1 g was placed in the quartz ampule 101. The heat-treatment was performed under the same temperature and pressure conditions as in Example 1.

The disassembly of the apparatus 130 after the cooling revealed solidified Zn at the lower of the ampule 101. The ZnSe substrates 9 and 12 placed to face each other were easily separated without sticking together. The aluminum films 10 and 11 deposited on the ZnSe substrates 9 and 12 were not observed on the surface of the substrates with naked eye. They were thought to have disappeared by diffusing into the crystal and dispersing into the atmosphere. The surface of the heat-treated ZnSe substrate 9 where the aluminum film 10 had once been deposited was repolished to reduce the thickness by 50 μm. Then, the properties of the substrate were measured.

The carrier density at the surface was $6\times10^{17}$ cm$^{-3}$, demonstrating that the resistivity was reduced. However, the maximum local value of the dislocation density at the surface was about $3\times10^4$ cm$^{-2}$. This value showed that the dislocation density of the crystal increased due to the heat-treatment. The distribution of the aluminum concentration at the surface of the heat-treated ZnSe substrate was measured by secondary-ion mass spectrometry (SIMS). The aluminum concentration was $1.1\times10^{19}$ cm$^{-3}$ at the central portion and $1.7\times10^{18}$ cm$^{-3}$ at the peripheral portion. The results show that the aluminum concentration decreased at the peripheral portion. The results are attributable to the following phenomena. The Al not only vaporizes but also chemically reacts with SiO at the peripheral portion of the ZnSe substrate, where the Al is exposed to the gaseous atmosphere. As a result, the amount of Al at the periphery is reduced, decreasing the amount of Al diffusion into the ZnSe substrate at the periphery.

Embodiments of the present invention are explained in the above. The embodiments shown here can be modified as required. For example, the heat-treatment can be applied to substrates made of not only ZnSe but also another II-VI compound semiconductor such as ZnS, ZnTe, CdS, CdSe, or CdTe.

The embodiments disclosed in this specification are to be considered in all respects as illustrative and not restrictive. The scope of the present invention is indicated by the following claims rather than by the foregoing description. All changes that come within the meaning and range of equivalency of the claims are therefore intended to be embraced in the scope of the present invention.

What is claimed is:

1. A process of heat-treating II-VI compound semiconductors, the process comprising:
   (a) placing at least one II-VI compound semiconductor whose surface is in contact with aluminum in a heat-treating chamber that (i) has an inside surface formed by at least one material selected from the group consisting of pyrolytic born nitride, hexagonal-system boron nitride, sapphire, alumina, aluminum nitride, and polycrystalline diamond, and (ii) has a communication hole;
   (b) placing the heat-treating chamber in an outer container made of quartz;
   (c) evacuating the outer container and the heat-treating chamber with a vaccum pump; and
   (d) heat-treating the II-VI compound semiconductor or semiconductors in the heat-treating chamber containing a gaseous atmosphere containing the group II element constituting part of the II-VI compound semiconductor or semiconductors.

2. A process as defined by claim 1, the process further comprising evacuating the heat-treating chamber with a vacuum pump prior to heat-treating the II-VI compound semiconductor or semiconductors.

3. A process as defined by claim 1, wherein the contact between the II-VI compound semiconductor or semiconductors and aluminum is provided by forming an aluminum film on the surface of the semiconductor or semiconductors.

4. A process as defined by claim 3, wherein the aluminum film has a thickness of 1 to 200 nm.

5. A process as defined by claim 3, wherein:
   (a) two II-VI compound semiconductors are prepared; and
   (b) the two semiconductors are placed in the heat-treating chamber such that the aluminum films are in contact with each other.

6. A process as defined by claim 1, wherein the heat-treatment is performed at a temperature of 660 to 1,200° C.

7. A process as defined by claim 1, wherein the heat-treatment is performed for for 1 to 800 hours.

8. A process as defined by claim 1, wherein the heat-treated II-VI compound semiconductor or semiconductors are cooled at a rate of 1 to 200° C./min.

9. A process as defined by claim 8, wherein the cooling of the heat-treated II-VI compound semiconductor or semiconductors is performed by providing in the heat-treating chamber a portion having a temperature lower than that of the semiconductor or semiconductors by 1 to 100° C.

10. A process as defined by claim 1, wherein the II-VI compound semiconductor or semiconductors are made of ZnSe.

11. A II-VI compound semiconductor, heat-treated by:
    (a) placing at least one II-VI compound semiconductor whose surface is in contact with aluminum in a heat-treating chamber that (i) has an inside surface formed by at least one material selected from the group consisting of pyrolytic born nitride, hexagonal-system boron nitride, sapphire, alumina, aluminum nitride, and polycrystalline diamond, and (ii) has a communication hole;
    (b) placing the heat-treating chamber in an outer container made of quartz;
    (c) evacuating the outer container and the heat-treating chamber with a vaccum pump; and
    (d) heat-treating the II-VI compound semiconductor or semiconductors in the heat-treating chamber containing a gaseous atmosphere containing the group II element constituting part of the II-VI compound semiconductor or semiconductors.

12. A II-VI compound semiconductor as defined by claim 11, having an aluminum concentration of $1\times10^{16}$ to $5\times10^{20}$ cm$^{-3}$ and a dislocation density of at most $5\times10^4$ cm$^{-2}$ in the region from the main surface to a depth of 300 μm.

* * * * *

UNITED STATES PATENT AND TRADEMARK OFFICE
CERTIFICATE OF CORRECTION

PATENT NO. : 6,881,658 B2
DATED : April 19, 2005
INVENTOR(S) : Yasuo Namikawa

It is certified that error appears in the above-identified patent and that said Letters Patent is hereby corrected as shown below:

<u>Title page,</u>
Item [57], ABSTRACT,
Line 8, replace "born" with -- boron --

<u>Column 2,</u>
Line 44, replace "born" with -- boron --

<u>Column 3,</u>
Line 41, replace "born" with -- boron --

<u>Column 5,</u>
Line 65, replace "born" with -- boron --

<u>Column 8,</u>
Line 21, replace "born" with -- boron --

<u>Column 11,</u>
Line 46, replace "born" with -- boron --

<u>Column 12,</u>
Line 38, replace "born" with -- boron --

Signed and Sealed this

Nineteenth Day of July, 2005

JON W. DUDAS
*Director of the United States Patent and Trademark Office*